United States Patent [19]
Yamaji et al.

[11] Patent Number: 6,088,321
[45] Date of Patent: Jul. 11, 2000

[54] VOLUME HOLOGRAPHIC MEMORY APPARATUS HAVING A REFERENCE BEAM AND A SIGNAL BEAM WITH OPPOSITE INTENSITY DISTRIBUTIONS

[75] Inventors: Takashi Yamaji; Hideki Hatano; Satoru Tanaka, all of Tsurugashima, Japan

[73] Assignee: Pioneer Electronic Corporation, Tokyo, Japan

[21] Appl. No.: 09/274,969

[22] Filed: Mar. 23, 1999

[30] Foreign Application Priority Data

Mar. 27, 1998 [JP] Japan .................................. 10-081258

[51] Int. Cl.[7] .............................. G03H 1/00; G11B 7/00
[52] U.S. Cl. .............................. 369/103; 369/112; 359/11
[58] Field of Search .............................. 369/103, 99, 100, 369/112; 359/10, 32, 11, 22, 24, 25, 29; 365/125, 216

[56] References Cited

U.S. PATENT DOCUMENTS

| | | |
|---|---|---|
| 5,291,471 | 3/1994 | Russell ..................................... 369/103 |
| 5,339,305 | 8/1994 | Curtis et al. ............................. 369/112 |
| 5,438,439 | 8/1995 | Mok et al. ................................ 359/10 |
| 5,543,251 | 8/1996 | Taylor ....................................... 359/11 |
| 5,696,613 | 12/1997 | Redfield et al. .......................... 359/32 |
| 5,777,760 | 7/1998 | Hays et al. ............................... 369/103 |
| 5,822,090 | 10/1998 | Wilde ....................................... 369/103 |
| 5,859,808 | 1/1999 | Campbell et al. ....................... 365/216 |
| 5,914,802 | 6/1999 | Stappaerts et al. ..................... 359/279 |
| 5,920,536 | 7/1999 | Campbell et al. ....................... 369/102 |

*Primary Examiner*—John W. Cabeca
*Assistant Examiner*—Kim-Kwok Chu
*Attorney, Agent, or Firm*—Sughrue, Mion, Zinn, Macpeak & Seas, PLLC

[57] ABSTRACT

A volume holographic memory-based optical information-recording/reproducing apparatus is capable of enhancing density of spatial multiple recording. A recording medium is mounted in the apparatus for recording a three-dimensional optical interference pattern formed by at least two coherent light beams as spatial changes in refractive index of the recording medium. A signal beam optical system supplies a coherent signal beam to the recording medium through a Fourier transform lens. A reference beam optical system supplies a coherent reference beam to the recording medium. The reference beam is caused to intersect with the signal beam within the recording medium and an angle of intersection between the reference beam and the signal beam is changed. Diffracted light of the reference beam diffracted from the recording medium is detected. Spatial beam modulating means is arranged in the optical path of the reference beam optical system for limiting light intensity of the reference beam in a manner such that a cross section of the reference beam in the recording medium has a light intensity distribution opposite to a light intensity distribution of the signal beam in the recording medium.

40 Claims, 12 Drawing Sheets

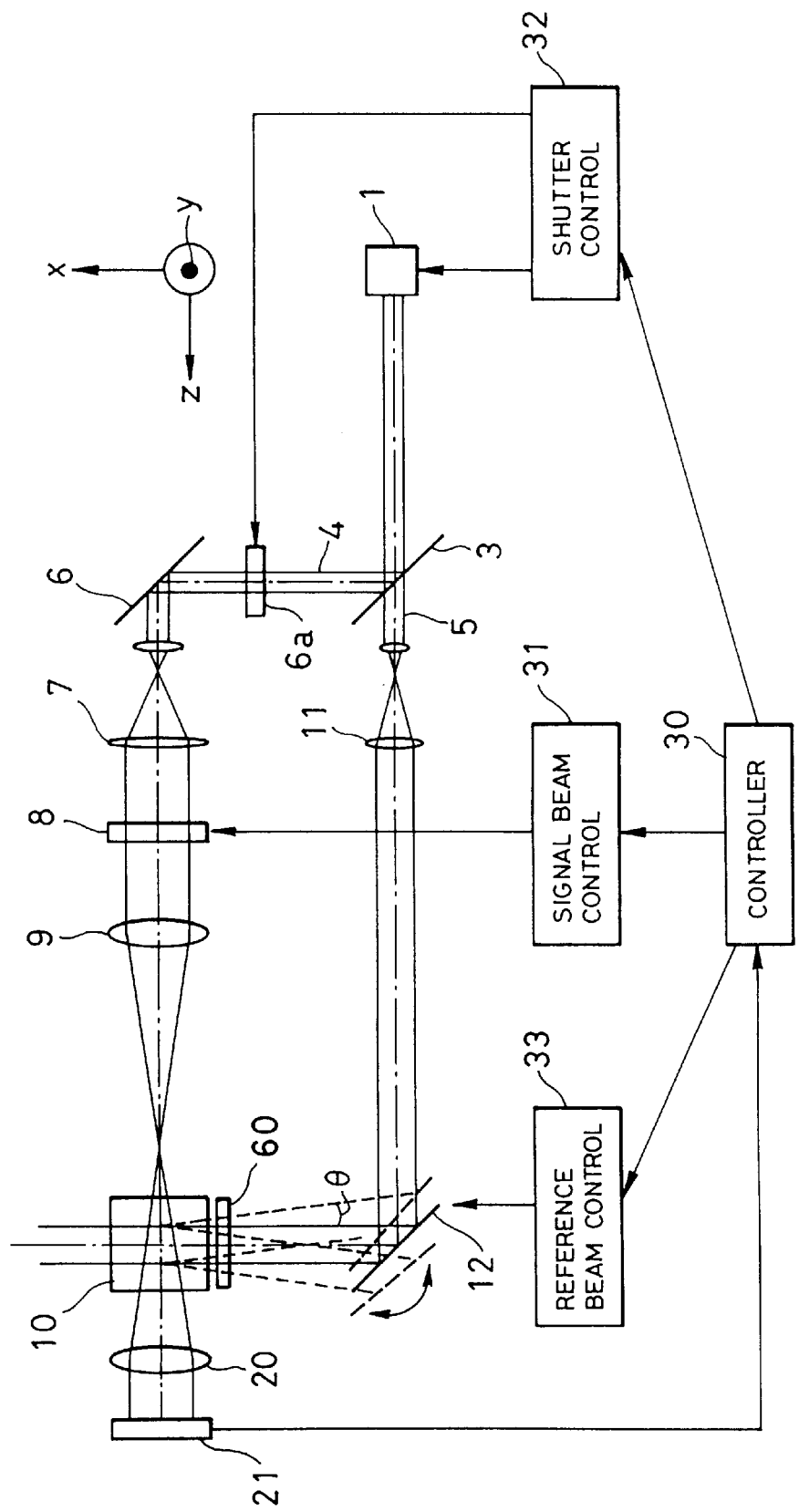

SIGNAL BEAM INTENSITY
DISTRIBUTION ON x-y PLANE

SIGNAL BEAM INTENSITY
DISTRIBUTION ON y-z PLANE

SIGNAL BEAM INTENSITY

TRANSMITTANCE DISTRIBUTION OF LCD
IN REFERENCE BEAM OPTICAL SYSTEM

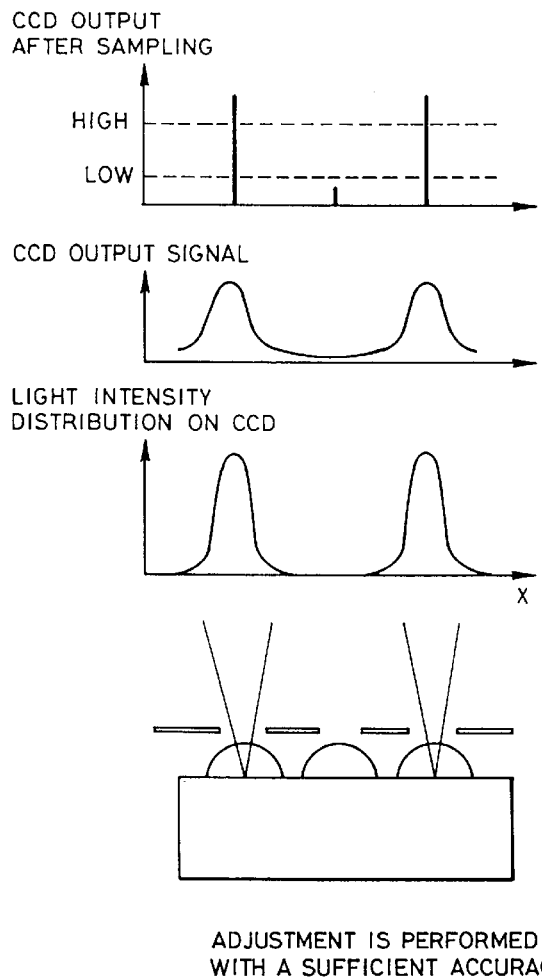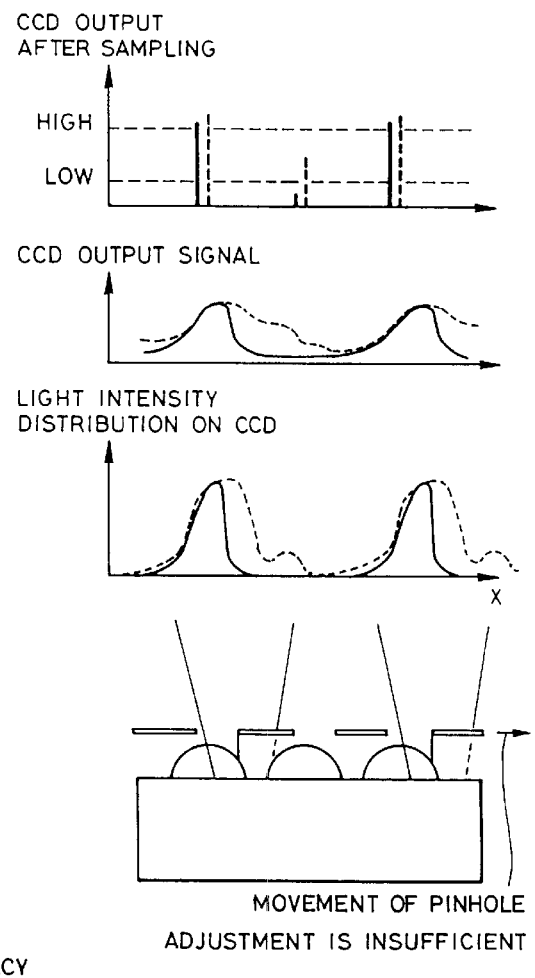

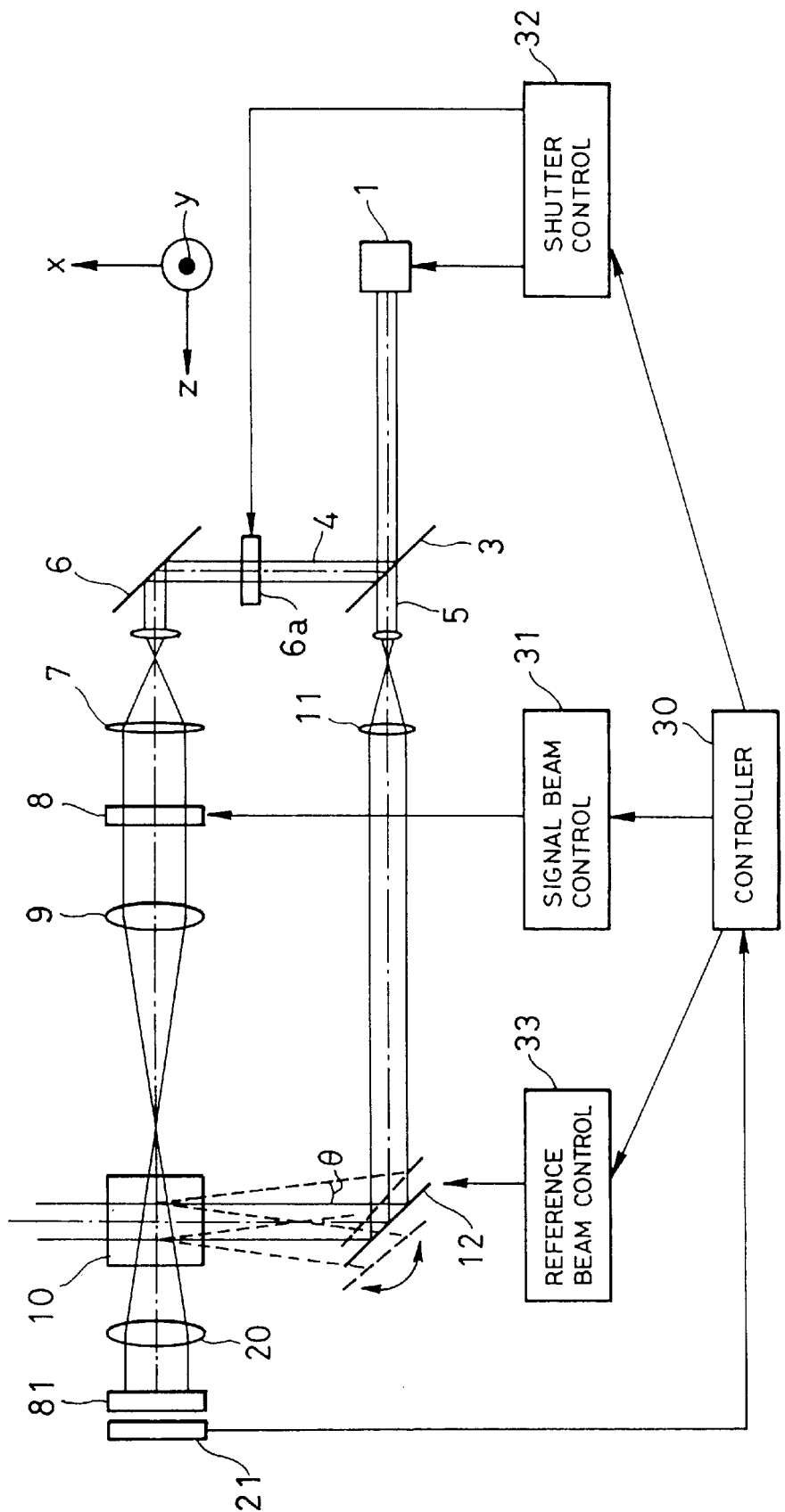

VOLUME HOLOGRAPHIC MEMORY APPARATUS HAVING A REFERENCE BEAM AND A SIGNAL BEAM WITH OPPOSITE INTENSITY DISTRIBUTIONS

BACKGROUND OF THE INVENTION

1. Field of the Invention

This invention relates to a Fourier transform hologram, and more particularly to a volume holographic memory-based optical information-recording/reproducing apparatus.

2. Description of the Related Art

When parallel light perpendicularly impinges on an image formed on a plane as a dot pattern of light and dark having a transmittance distribution, the parallel light is diffracted intensely in a direction perpendicular to the structure thereof.

In general, an image can be considered to be an overlap of various spatial frequency components in different directions, just as an electric signal or an acoustic signal which varies with time can be considered to be decomposed into various sinusoidal wave components. Mathematically, distribution of the spatial frequency components can be obtained by calculating a two-dimensional Fourier transform.

Optically determining an angular distribution of amplitude of diffracted light which is diffracted under the Fraunhofer's law by causing uniform parallel light to impinge on an image is equivalent to mathematically calculating the two-dimensional Fourier transform of amplitude transmittance of the image. A Fourier transform hologram is formed by causing diffracted light from an image illuminated by coherent parallel light, i.e. a signal light to pass through a Fourier transform lens disposed apart from the illuminated image by a focal distance thereof, to cause an image as a distribution of the signal light to be formed on a focal surface or Fourier surface, then causing interference between the distribution of the signal light resulting from the Fourier transform and a coherent reference beam, and recording the distribution of the signal light as interference fringes on a photosensitive material applied on a flat plate.

A wavefront recorded in the Fourier transform hologram corresponds to an image transformed through Fourier transform, so that it is required to perform inverse Fourier transform to reproduce the image from the wavefront. The inverse Fourier transform is performed by reproducing the diffracted light by illuminating the planar Fourier transform hologram with the identical reference beam and converging the diffracted light by means of the Fourier transform lens. Thus, the amplitude transmittance distribution of the original image is reproduced on the Fourier surface.

As described above, the planar Fourier transform hologram is capable of not only storing a hologram within a limited space but also enhancing redundancy of a record through dispersion of information in space by Fourier transform.

Another type of Fourier transform hologram is a volume hologram having a larger thickness than that of such a planar recording medium described above. Generally, the volume hologram is capable of attaining an enhanced diffraction efficiency, so that it has an advantage in recording bulk information. In the volume holographic memory, information is stored in units of two-dimensional image pages dispersed in a three-dimensional space of the recording medium.

In recent years, a recording medium, such as a photo refractive crystal of lithium niobate (LN), has drawn attention as a volume holographic memory which is capable of recording a three-dimensional interference pattern therein as spatial changes in refractive index of the recording medium.

This photo refractive effect utilized in the recording medium is a phenomenon in which electric charge generated by optical pumping moves within the crystal to form a space electric field, and the space electric field causes a linear electro-optical effect, i.e. the Pockels effect, to change the refractive index of the crystal. For example, in a ferro-electric crystal having the photo refractive properties, a change in refractive index occurs in response even to a fine optical input pattern generally having 1000 lines or more per millimeter therein. Further, the photo refractive effect is generated in real time at a response speed in the order of microseconds to seconds in dependence on the material of a crystal. Therefore, research has been carried out for various applications of the photo refractive crystal as a real-time holographic medium which does not require development of an image.

In recording digital data in the holographic memory, digital data is converted to a dot pattern image of light and dark, for example, on a plane of a panel of a transmissive thin film transistor liquid crystal display (hereinafter referred to as "LCD") by using spatial optical ON/OFF signals, and interference between diffracted light from the image data, i.e. a signal beam, and a coherent reference beam is caused, to record the interference pattern in a rectangular parallel-epiped recording medium. In reading the digital data from the holographic memory, the image of the dot pattern is regenerated by irradiating the holographic memory with the same light beam as the reference beam. The regenerated image is received by a photoelectric detector array, and an output signal from the detector array is processed by an electronic circuit to convert the output signal back to the digital data for reading.

The image data is recorded in a portion of the recording medium where the signal beam and the reference beam intersect with each other, so that it is possible to perform space multiple recording by properly shaping a cross section of the reference beam in a manner adapted to a shape of the recording medium. For example, if the reference beam is shaped into a beam having an elliptical cross section having a vertical length of 1 mm and a horizontal length of 4 mm, it is possible to perform multiple recording in a vertical direction, at space intervals of 1 mm. In this case, the signal beam and the reference beam are made coincident at a position for recording.

On the other hand, in conventional volume holographic recording performed by the use of a Fourier transform lens, if interference between a signal beam and a reference beam is caused in the vicinity of a Fourier surface, light intensity becomes saturated, for example, at the center of a 0-order light beam, resulting in a deformed recorded image.

Therefore, interference between the two light beams is caused slightly away from the Fourier surface, so as to prevent light intensity from being saturated. However, this method, in which the light intensity of the signal beam and that of the reference beam are required to be adjusted on the basis of spectral distribution of a recording beam after Fourier transform, is not suitable for multiple recording of various signals having different spatial frequency components.

Further, a CCD image sensor (hereinafter simply referred to as "CCD") and the LCD, each of which uses a matrix of a plurality of charge coupled devices, have been developed in the fields of techniques of image pick-up and image display, respectively, and each required to have a larger open area ratio for improvement of its performance. However, when these devices are applied in the field of digital volume holography, crosstalk between adjacent pixels is increased due to their high open area ratio, resulting in degradation of a reproduced holographic image.

Still further, conventionally, an apparatus of this kind uses a CCD having a higher open area ratio and is configured such that a brighter reproduced image can be obtained. To this end, a tolerance in positioning is limited to a value equivalent to a distance between adjacent light receivers of the CCD (or several pm or less), which requires high assembling accuracy.

Basically, the CCD is susceptible to crosstalk between adjacent pixels. Therefore, as the light-receiving area is increased to obtain a higher signal level, the crosstalk between adjacent pixels becomes larger.

To overcome this problem, when the charge coupled devices used as light receivers for a digital information-recording/reproducing apparatus, an approach is employed in which one information unit (1 bit to a few bits) is formed by a plurality of pixels adjacent to each other, for example, two or four pixels, for reduction of the adverse effect of crosstalk.

However, this approach suffers from redundancy of information and reduces the density of recording.

Moreover, in multiple recording in which the photo refractive effect is utilized for recording information as diffraction gratings, preceding recorded diffraction gratings are progressively erased as the multiple recording of subsequent diffraction gratings proceeds. An attenuation coefficient of this erasure is referred to as the erasing time constant. It is required that measurement of an erasing time constant be carried out in advance on a medium for use in recording. The relationship in recording time between pages, which depends on the order of recording, is determined based on the erasing time constant. The operation for this determination is referred to as scheduling. Multiple recording is performed following results of the scheduling, whereby a reproduced image having a desirable brightness can be obtained.

However, crystals are different from each other in an optical constant, the response speed, the degree of polarization, the erasing time constant, etc., which makes it difficult to attain homogeneous recording.

SUMMARY OF THE INVENTION

It is a first object of the present invention to provide a volume holographic memory-based optical information-recording/reproducing apparatus which is capable of enhancing the density of spatial multiple recording.

It is another object of the invention to provide a volume holographic memory-based optical information-recording/reproducing apparatus which is capable of reducing crosstalk between adjacent pixels and having a broader tolerance of positioning.

It is a further object of the invention to provide a volume holographic memory-based optical information-recording/reproducing apparatus which is capable of carrying out homogeneous recording.

To attain the above objects, the present invention provides a volume holographic memory-based optical information-recording/reproducing apparatus in which a recording medium is mounted for recording a three-dimensional optical interference pattern formed by at least two coherent light beams as spatial changes in refractive index of the recording medium. The apparatus further comprises a signal beam optical system for supplying a coherent signal beam to the recording medium through a Fourier transform lens, a reference beam optical system for supplying a coherent reference beam to the recording medium, means for causing the reference beam to intersect with the signal beam within the recording medium to change an angle of intersection between the reference and signal beams, and means for detecting diffracted light of the reference beam diffracted from the recording medium.

The volume holographic memory-based optical information-recording/reproducing apparatus is characterized by comprising spatial beam modulating means arranged in the optical path of the reference beam optical system for limiting light intensity of the reference beam in a manner such that a cross section of the reference beam in the recording medium has a light intensity distribution opposite to a light intensity distribution of the signal beam in the recording medium.

This volume holographic memory-based optical information-recording/reproducing apparatus makes it possible to modulate the reference beam spatially and in phase in response to a recording signal, for optimum recording in a desirable spot within the recording medium, thereby enhancing density of spatial multiple recording.

Preferably, the light intensity distribution of the signal beam results from transformation of the signal beam by the Fourier transform lens within a plane containing the signal beam and perpendicular to a plane on which the signal beam and the reference beam both lie. The spatial beam modulating means modulates the reference beam in a manner such that the reference beam in the recording medium has a cross section having a light intensity distribution generally opposite in phase to the light intensity distribution of the signal beam in the recording medium resulting from transformation of the signal beam by the Fourier transform lens.

Preferably, the spatial beam modulating means modulates the reference beams in a manner such that the cross section of the reference beam has a light intensity distribution in which intensity is lowest on a side of the recording medium on which the signal beam is incident and increases progressively toward an opposite side of the recording medium.

Preferably, the spatial beam modulating means comprises a liquid crystal panel arranged perpendicularly to the plane on which the signal beam and the reference beam exists and in parallel with the plane containing the signal beam. The crystal panel is electrically controlled to undergo a change to have an optically transparent portion having a transmittance distribution in which transmittance is lowest on a side of the recording medium on which the signal beam is incident and increases progressively toward an opposite side of the recording medium and which is opposite in phase to the light intensity distribution of the signal beam, and an optically opaque portion.

More preferably, the spatial beam modulating means includes a Fourier transform lens having a Fourier surface thereof spaced from an optical axis of the signal beam and at least one spatial light modulator. The spatial light modulator comprises a diffraction grating that forms a light intensity distribution of 0-order diffracted light of the reference beam by means of the Fourier transform lens substantially in parallel with the optical axis of the signal beam.

Preferably, the means for detecting the diffracted light comprises a charge coupled element image sensor having a plurality of light-receiving pixel elements disposed on a plane perpendicular to an optical axis of the diffracted light from the recording medium at predetermined intervals of a pitch, a pinhole array formed by a flat shade board having a plurality of apertures formed at the predetermined intervals of a pitch in a manner corresponding to the light-receiving pixel elements. The flat shade board is held apart from the light-receiving pixel elements in a manner movable along the plane in directions orthogonal to each other. The means for detecting the diffracted light further comprises a drive element for driving the pinhole array in the directions orthogonal to each other.

More preferably, the drive element comprises a piezo-electric element.

More preferably, the pinhole array comprises a microlens array having convex lens fitted in the plurality of apertures, respectively, and shading material filling between the convex lenses.

Preferably, the pinhole array comprises a microlens array having distribution dioptric flat plate lens fitted in the plurality of apertures, respectively, and shading material filling between the distribution dioptric flat plate lenses.

Preferably, the volume holographic memory-based optical information-recording/reproducing apparatus further comprises monitoring means for detecting diffracted light leaking from a portion inside the recording medium in which the reference and signal beams intersect with each other, and shutter control means for controlling blink of the signal beam in response to a signal from the monitoring means.

According to the above arrangement, when an erasing time constant is sufficiently larger than a value of a response speed during recording, by obtaining a typical erasing time constant, calculating a basic schedule from the erasing time constant, and detecting formation of the diffraction gratings during recording, it is possible to record information by feedback control carried out in a manner such that diffraction efficiency estimated from the schedule is obtained.

More preferably, the monitoring means comprises means for detecting the diffracted light of the reference beam from the recording medium and having a filter for decreasing quantity of received light.

More preferably, the volume holographic memory-based optical information-recording/reproducing apparatus further comprises monitoring beam-irradiating means for irradiating the portion inside the recording medium in which the reference beam and the signal beam intersect with each other with a monitoring beam having a wavelength different from that of the signal beam, and means for moving the monitoring beam-irradiating means in a manner such that the monitoring means can receive the monitoring beam reflected from the portion inside the recording medium.

BRIEF DESCRIPTION OF THE DRAWINGS

The aforementioned aspects and other features of the invention are explained in the following description, taken in connection with the accompanying drawing figures wherein:

FIG. 1 is a block diagram showing an embodiment of a volume holographic memory-based optical information-recording/reproducing apparatus according to the invention;

FIGS. 6A and 6B are views explaining effects of the two-dimensional photodetector array;

FIG. 10 is a block diagram showing essential parts of a further embodiment of a volume holographic memory-based optical information-recording/reproducing apparatus according to the invention;

DETAILED DESCRIPTION OF THE PREFERRED EMBODIMENTS

Figure 2A:
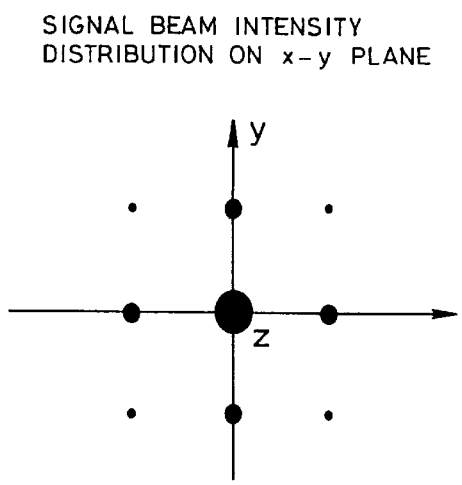
FIG. 2A is a diagram showing a spatial frequency intensity distribution of a signal beam.

The invention will now be described in detail with reference to drawings showing embodiments thereof. Identically labeled elements appearing in different figures refer to the same elements but may be not be referenced in the description for all figures.

In each of the following embodiments in which a volume holographic memory is mounted in an optical information recording/reproducing apparatus, description is made by using an angle multiple recording apparatus for carrying out multiple recording in an identical space within a recording medium by changing the irradiation angle of a reference beam. In the angle multiple recording apparatus, an amount of information corresponding to one page of image is recorded/reproduced using the reference beam irradiated at a preset irradiation angle, and by irradiating the reference beam at a substantially identical spot of the recording medium at different irradiation angles, an amount of information corresponding to a plurality of pages is recorded/reproduced. In this case, each irradiation angle is required to have a range large enough to prevent occurrence of crosstalk between pages of images adjacent to each other when the stored information is read out.

A recording medium used in the present embodiment is a photo refractive crystal for recording three-dimensional optical interference patterns as spatial changes in refractive index occurring within the crystal. More specifically, in most cases, a crystal of lithium niobate (LN) is used. LN is suitable for holographic multiple recording because its service life is relatively long, fixation is possible, and it is easy to deal with.

FIG. 1 shows a block diagram of a first embodiment of an optical information-recording/reproducing apparatus including a volume holographic memory according to the present invention.

A light beam emitted from a laser diode 1 is split by a translucent mirror 3 into a signal beam 4 and a reference beam 5. The two light beams are guided into an optical path of a signal beam optical system and an optical path of a reference beam optical system, respectively. Generally, in a laser diode, a light beam emitted as a linearly polarized light is modulated by an ND (neutral density) filter such that it has a predetermined light intensity. Then, a time period over which a recording medium is illuminated with the light beam is controlled by an automatic shutter controlled from outside. A half-wave plate may be used to control a direction of deflection of the beam incident on the recording medium.

The signal beam 4 reflected off the translucent mirror 3 passes through a shutter 6a, a reflecting mirror 6, a light beam expander 7, a spatial light modulator 8, and a Fourier transform lens 9 to be applied to a recording medium 10. More specifically, the signal beam 4 is expanded by the beam expander 7 into a parallel pencil of rays having a predetermined diameter, spatially modulated by the spatial light modulator 8 according to recording page data, i.e. spatially modulated to a two-dimensional grating patterns according to the permission or inhibition of transmission of each pixel, then subjected to Fourier transform by the Fourier transform lens 9 and converged on the recording medium 10, thereby forming an image in the recording medium as a Fourier transform image. Also in the present embodiment, the direction of deflection of the signal beam 4 may be controlled by the half-wave plate, and adjusted by an ND filter to have a predetermined light intensity.

On the other hand, in the reference beam optical system, the reference beam 5 passes through a light beam expander 11 and a pager reflecting mirror 12 to be applied to the recording medium 10. The signal beam 4 and the reference beam 5 intersect with each other inside the recording medium 10. The reference beam 5 which passed through the translucent mirror 3 is expanded by the beam expander 11 into a parallel pencil of rays having a predetermined diameter. At this time, the reference beam 5 may have its light intensity adjusted by an ND filter. Thereafter, the reference beam 5 is controlled by the pager reflecting mirror 12 to be applied to the recording medium at respective predetermined angles. Paging operation of the pager reflecting mirror 12 is controlled by sliding of the mirror 12 and changing of its angle of deflection such that an identical portion of the recording medium is irradiated with reference beams 5 having respective different incidence angles.

The signal beam 4 which passed through the Fourier transform lens 9 and the reference beam 5 reflected by the pager mirror 12 interfere with each other within the recording medium 10 to form a hologram. More specifically, in recording data, the signal beam 4 and the reference beam 5 are irradiated on the recording medium 10 simultaneously, and changes in refractive index occurring in the recording medium 10 are recorded as an interference pattern. A time period during which a hologram is formed is controlled by the automatic shutter of the laser diode.

In reproducing the recorded optical information, the shutter 6a is closed, and hence only the reference beam 5 reflected by the pager reflecting mirror 12 is irradiated on the recording medium 10, whereby diffracted light forms an image on a two-dimensional photodetector array 21 including a CCD via an inverse Fourier transform lens 20. Pixels of the CCD and pixels of an LCD are adjusted such that they have a one-to-one correspondence between them. The correspondence pattern between the CCD pixels and the LCD ones may be not only one-to-one but also one-to-four, four-to-one, or the like. Thus, when the information is reproduced, it is possible to read data by applying the reference beam 5 alone to the interference pattern recorded in the recording medium 10.

In this apparatus, a digital signal to be recorded is entered to a controller 30 and subjected to processing such as addition of an error-correcting code, binary coding, etc. Then, the digital signal is converted by a signal beam control driver 31 to a signal indicative of a page image array. Data of each page is then delivered as a page image to the transmission spatial light modulator 8 such as an LCD to form image data. The controller 30 controls a time period over which the recording medium 10 is to be irradiated with the two beams with the image data existing in the spatial light modulator 8 by means of a shutter control driver 32 that automatically controls the opening and closing the laser diode.

At the same time, the controller 30 shifts the pager reflecting mirror 12 by means of a reference beam control driver 33 to change an angle position of the mirror 12 in accordance with the image data, whereby the reference beam 5 set to enter the recording medium 10 at a predetermined incidence angle ($\theta$) is applied to the same over a predetermined time period to write a hologram therein.

Subsequently, the procedure for sending a page image, setting the incidence angle of the reference beam 5, and recording a hologram is repeatedly carried out. One page of information is stored per incidence angle variably set to the reference beam 5.

The process of information reproduction is as follows: the controller 30 causes the shutter 6a to close, and moves the pager reflecting mirror 12 by means of the, reference beam control driver 33 to set the incidence angle of the reference beam 5 to a predetermined value which is identical to one of the values determined when the information was recorded; the reference beam alone is applied to the recording medium 10; and a diffracted light from one of the recorded interference patterns is focussed by the inverse Fourier transform lens 20 to form an image of the reproduced page on the two-dimensional photodetector array 21 including the CCD. It is necessary that the light intensity of the reference beam is set to a sufficiently low value, compared with the value used in recording, to prevent the recorded information from being erased. Further, it is required to set the shutter control driver 32 and the reference beam control driver 33 for proper control of the irradiation time of the reference beam such that a photodetector output can have a proper S/N (signal-to-noise) ratio. The controller 30 carries out signal processing, such as decoding, error correction processing, etc., of the photodetector output, whereby the information recorded in the recording medium 10 is read.

As shown in FIG. 2A, if the optical axis of the signal beam is set in a z direction, a reference optical axis of the reference beam which is not set to an angle in an x direction, and a direction orthogonal to these z and x directions is set as a y direction, when interference between the signal beam and the reference beam is caused within the recording medium 10 for recording, a spatial frequency spectral distribution intensity occurs at spots symmetric with each other with respect to the optical axis of the signal beam on an x-y plane parallel to a Fourier surface. The light intensity is saturated particularly at the center of a 0-order light beam extending in the z direction as shown in FIG. 2B, which causes deformation of a reproduced image.

Figure 2B:
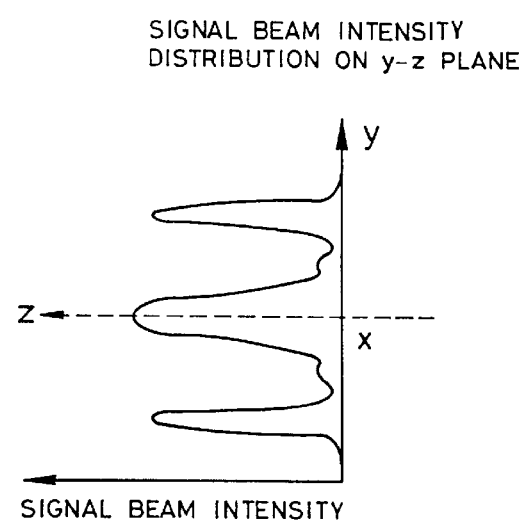
FIG. 2B is a diagram showing a spatial frequency intensity distribution of a signal beam.
Figure 3A:
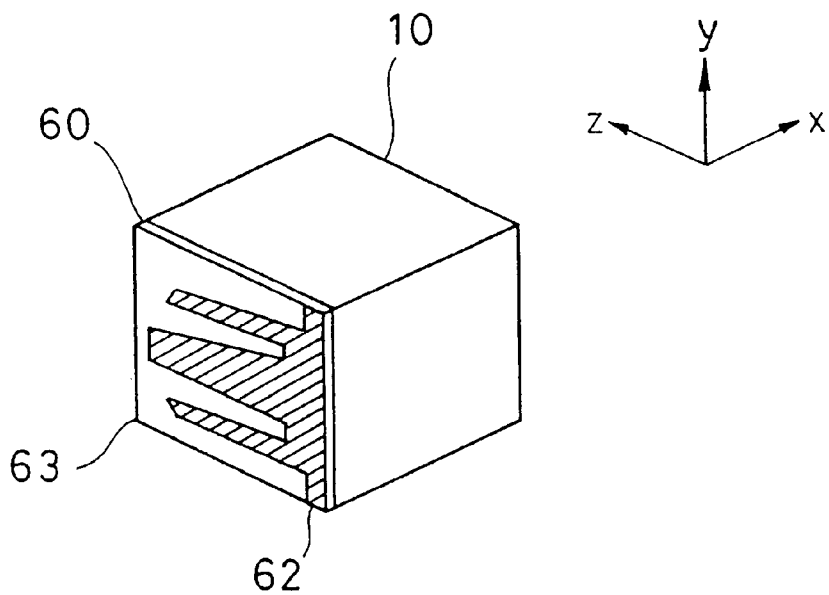
FIG. 3A is a perspective view showing a recording medium and a spatial light modulator.
Figure 3B:
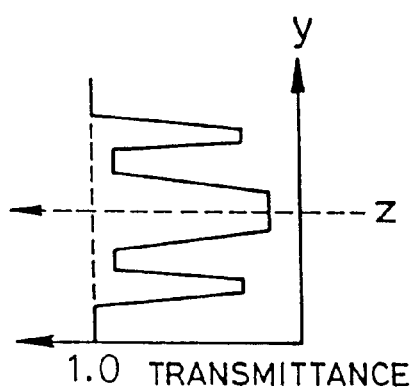
FIGS. 3B and 3C are diagrams showing transmittance distribution.
Figure 3C:
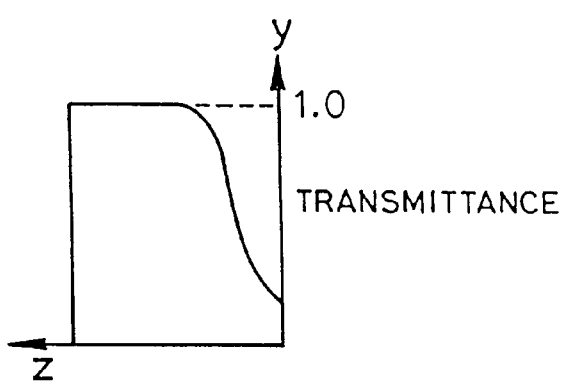

To overcome this problem, the volume holographic memory-based optical information-recording/reproducing apparatus of the invention includes a second spatial beam modulating means 60 arranged in the optical path of the reference beam optical system for limiting the light intensity such that the cross section of the reference beam in the recording medium 10 has a light intensity distribution opposite in phase to that of the signal beam shown in FIG. 2B to reduce amplitude of electric field distribution within the recording medium resulting from the interference between the two light beams to a sufficiently low level to prevent saturation of the light intensity. The light intensity distribution of the signal beam in the recording medium 10 as shown in FIG. 2B results from transformation of the signal beam by the Fourier transform lens within a y-z plane containing the signal beam and perpendicular to an x-z plane on which the signal beam and the reference beam both exist. In short, the second spatial beam modulating means 60 modulates the reference beam such that the reference beam in the recording medium has a cross section having a light intensity distribution generally opposite in phase to the FIG. 2B light intensity distribution of the signal beam in the recording medium 10 resulting from transformation of the signal beam by the Fourier lens. More specifically, as shown in FIGS. 1 and 3A, the second spatial beam modulating means 60 comprises a liquid crystal panel 60 arranged in parallel with the y-z plane, which is electrically controlled to have its transmittance changed. The liquid crystal panel 60 is controlled such that it has an optically transparent portion 63 having a transmittance distribution opposite in phase to the FIG. 2B light intensity distribution of the signal beam, and an optically opaque portion 62. Further, the liquid crystal panel 60 can be controlled to have an optically transparent portion 63 having a transmittance distribution in which transmittance is lowest on a side of the recording medium 10 on which the signal beam impinges and progressively increases toward the opposite side as shown in FIG. 3C, and an optically opaque portion 62. Still further, as shown in FIG. 3A, the liquid crystal panel 60 may have a transmittance distribution formed by overlaying the transmittance distribution shown in FIG. 3B upon that shown in FIG. 3C. Any one of the above optically opaque portions 62 includes a semi-translucent portion formed according to the transmittance thereof.

As described above, in the present embodiment, the LCD 60 is arranged in the optical path of the reference beam, particularly in the vicinity of the recording medium or in intimate contact with the same to spatially modulate the profile of the reference beam based on the spatial frequency spectral distribution of the signal beam, an absorption coefficient of the recording medium, and so forth, whereby the intensity of the reference beam is controlled not to be saturated at a spot of the Fourier surface at which the intensity of the signal beam is high. On the other hand, the intensity of the reference beam is relatively increased at a spot at which the intensity of the signal beam is low, so as to obtain diffraction efficiency. In this case, the effect can be enhanced by expanding the reference beam in cross section by the use of a light beam expander or the like.

Figure 4:
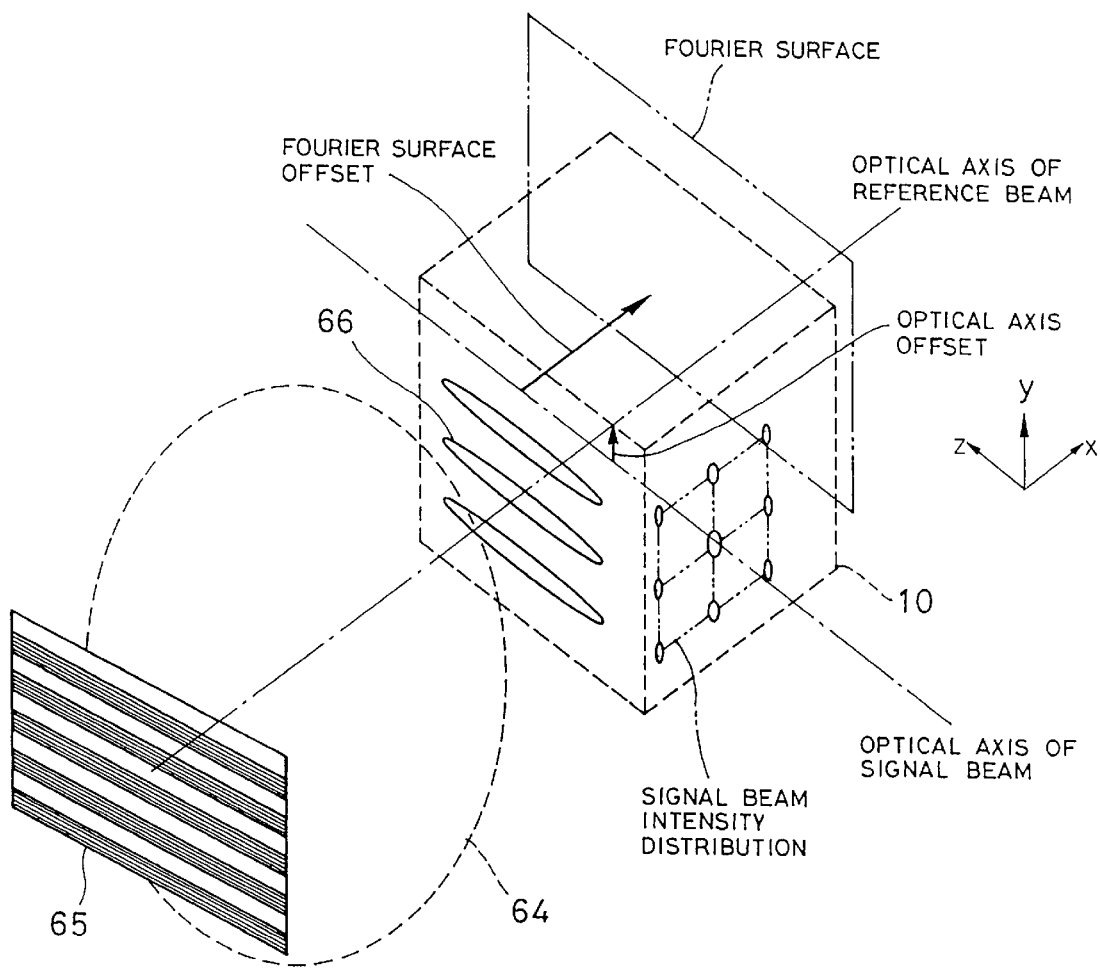
FIG. 4 is a perspective view showing a recording medium and a spatial light modulator.

As shown in FIG. 4, the second spatial beam modulating means 60 may comprise a combination of a Fourier transform lens 64 and at least one diffraction grating 65 comprised of a liquid crystal shutter arranged in parallel with the y-z plane, other than the liquid crystal panel. The Fourier transform lens 64 is arranged on the optical axis of the reference beam such that its Fourier surface is spaced away from the optical axis of the signal beam. The diffraction grating 65 is arranged such that the reference beam transmitted through the Fourier transform lens 64 forms a light intensity distribution 66 of a 0-order diffracted light substantially in parallel with the optical axis of the signal beam.

As described above, in the present embodiment, in order to prevent the light intensity of each of the signal beam and the reference beam from becoming high in the vicinity of the 0-order light, the Fourier transform lens system is inserted on the reference beam side, whereby the Fourier surfaces of the two beams at an intersection of these beams do not coincide with each other with resect to the origin, but the Fourier surface of the reference beam is offset along the optical axis of the reference beam toward a 1-order light-side of the signal beam. Further, it is possible to provide spatial light modulators for controlling irradiating position and quantity of light, respectively, inside and outside the Fourier transform lens system, respectively. These modulators make it possible to reduce the volume of the recording medium required for recording, enabling a larger number of pages of spatial multiple recording.

Next, a further embodiment of the present invention will be described.

Figure 5:
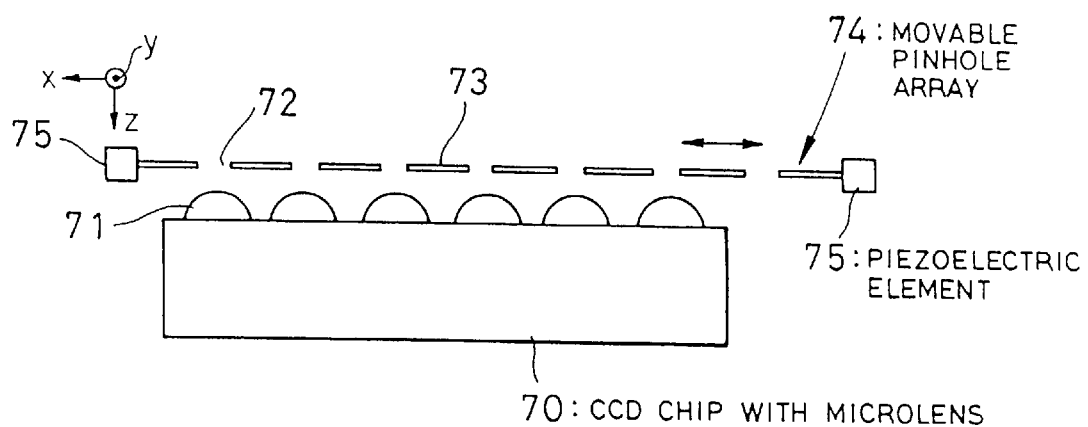
FIG. 5 is a view showing a further embodiment of a two-dimensional photodetector array according to the invention.

As shown in FIG. 5, in this embodiment, a two-dimensional photodetector array 21 shown in FIG. 1, i.e. light-detecting means for detecting a reproduced diffracted light beam includes a CCD 70 arranged on a plane perpendicular to the optical axis of the diffracted light from the recording medium, a pinhole array 74 comprised of a flat shade 73 having a plurality of apertures 72 formed therethrough with a predetermined pitch in a manner corresponding to a matrix of light-receiving pixel elements 71 on the CCD 70 and held apart from the matrix of light-receiving pixel elements 71 in a manner movable along the CCD plane in directions orthogonal to each other, and drive elements 75 consisting of piezoelectric elements for driving the pinhole array 74 in the directions orthogonal to each other.

Conventionally, an actual modularizing operation in a process of assembling and adjusting modules of a volume hologram-recording/reproducing apparatus using Fourier transform lenses requires extremely accurate positioning, for example, for mounting CCD photoreceptive elements at predetermined space intervals with an assembly tolerance of closer than space intervals of the CCD photoreceptive elements, so that the manufacturing step is a troublesome and time-consuming one. The two-dimensional photodetector array 21 of the present embodiment makes it possible to eliminate the above incovenience. That is, the movable pinhole array 74 driven by the piezoelectric elements is disposed slightly apart from the CCD pixels 71, which makes the assembly tolerance less close and permits fine adjustment after assemblage.

Further, the movable pinhole array 74 according to the embodiment can provide the following effects: FIG. 6A shows a case in which an optical adjustment actually carried meets criteria, while FIG. 6B shows cases in which the same is insufficient. In one case shown in FIG. 6B in which the optical adjustment is carried out without the movable pinhole array 74, as indicated by dotted lines in the figure, outputs from adjacent pixel elements which should not receive light are also contained in the distribution of light intensity on the CCD. As a result, a contrast in an image formed by the CCD output signals is reduced. That is, out of the CCD outputs after sampling, ones for use in imaging are affected by crosstalk from adjacent pixel elements, so that pixels which are originally expected to be below a level indicated at Low in the figure assume a medium value. This crosstalk actually causes serious degradation of the quality of a reproduced image.

On the other hand, in the other case shown in FIG. 6B in which the optical adjustment is carried out with the movable pinhole array arranged slightly apart from the CCD pixels, as indicated by solid lines in the figure, the open area ratio of the CCD is reduced by the pinhole array, whereby the amount of stray light incident on adjacent CCD pixels is decreased.

Figure 7:
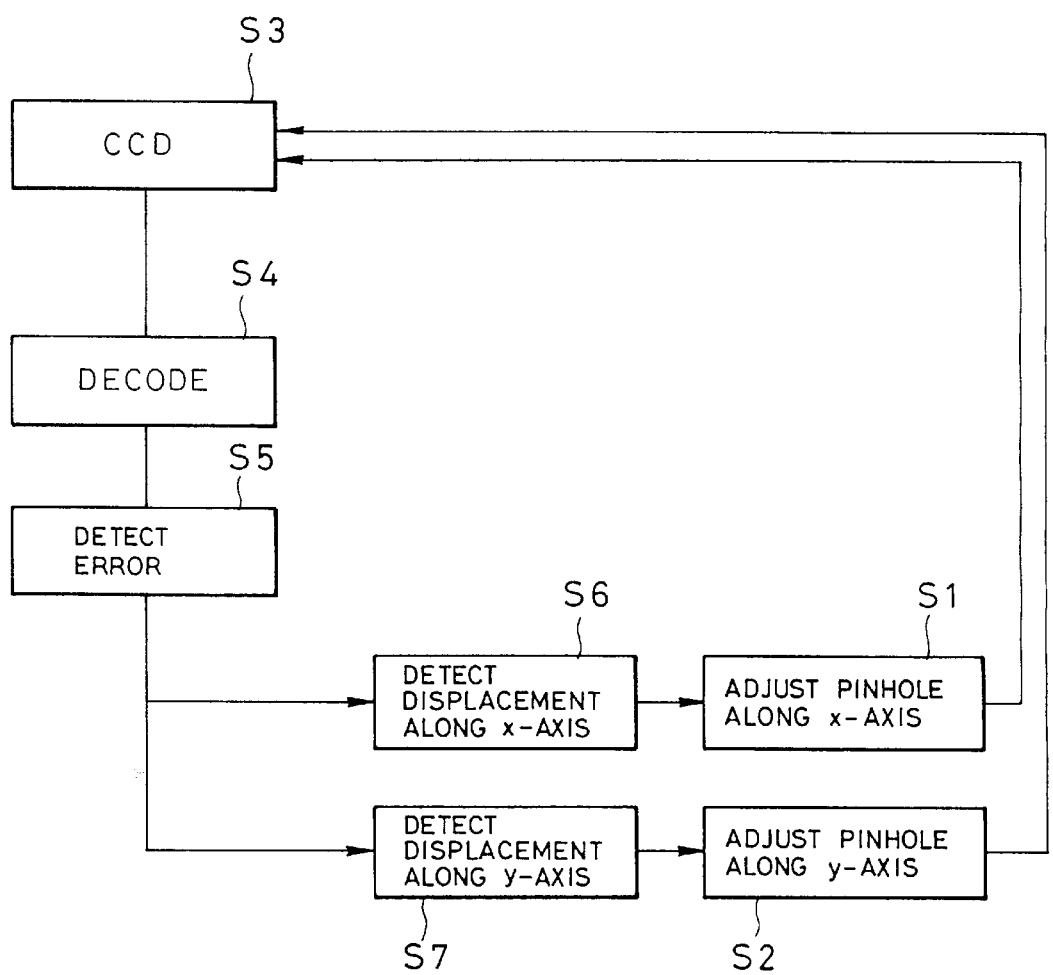
FIG. 7 is a flowchart showing a procedure of position control of the pinhole array.

Further, as shown in FIG. 7, the pinhole array 74 is moved in the X-Y directions with reference to x and y positions by the drive elements 75, such as piezoelectric elements so as to prevent the beam from entering the adjacent pixels as stray light (S1, S2), whereby the CCD outputs are obtained (S3) and demodulated (S4), error is detected (S5), the amount of displacement in the X-Y directions is detected based on the results of the error detection (S6, S7), and adjustment is repeatedly carried out according to the detected amount of displacement in the X-Y direction for optimization of signal intensity obtained. The piezoelectric elements for driving the movable pinhole array is only required to move the pinhole array by ±0.5 pixel for the adjustments.

Assuming that the open area ratio of the CCD limited by the movable pinhole array is equal to "1", an optimum open area of the LCD on the focus on the opposite side of the Fourier transform lens facing the CCD is in a range of 1 to 0.5.

Figure 8A:
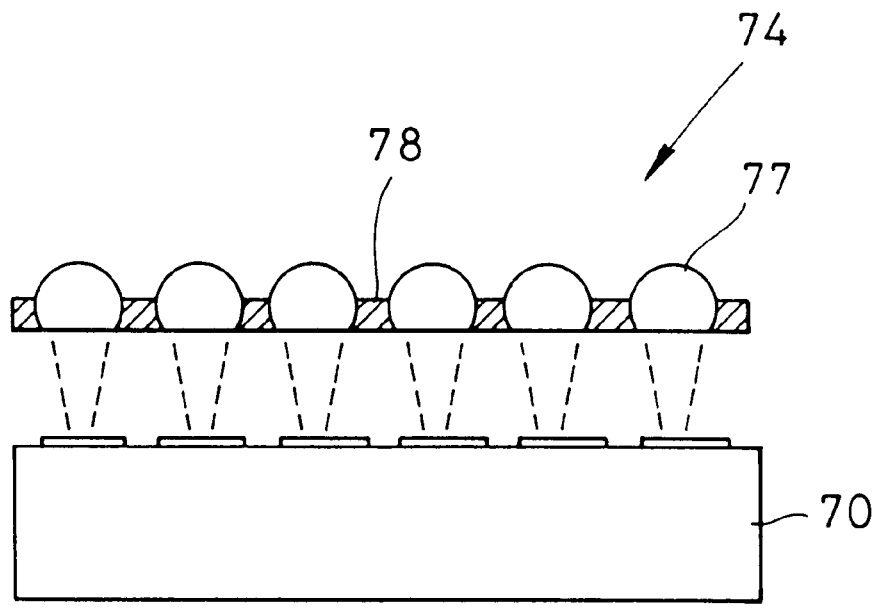
FIGS. 8A and 8B are views showing a further embodiment of of a two-dimensional photodetector array according to the invention.
Figure 8B:
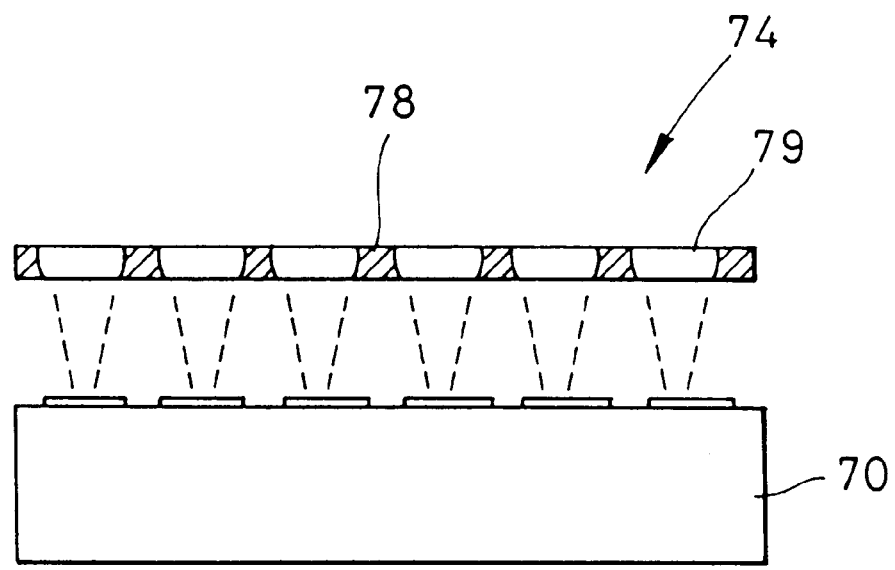

FIG. 8A shows a further embodiment according to the invention. The pinhole array 74 of the two-dimensional photodetector array 21 may comprise a microlens array having a plurality of convex lens 77 which are received in a plurality of apertures and a shielding material 78 filling space between the convex lenses 77. Further, as shown in FIG. 8B, the pinhole array 74 may comprise a microlens array having distribution dioptric flat plate lenses 79 fitted in the corresponding apertures and the shielding material 78 filling space between the lenses 79.

Next, a still further embodiment will be described.

According to this embodiment, the volume holographic memory-based optical information-recording/reproducing apparatus is provided with monitoring means for detecting diffracted light leaking from a portion within the recording medium in which the reference beam and the signal beam intersect with each other. A signal from the monitoring means controls shutter control means for controlling blink of the signal beam.

Figure 9A:
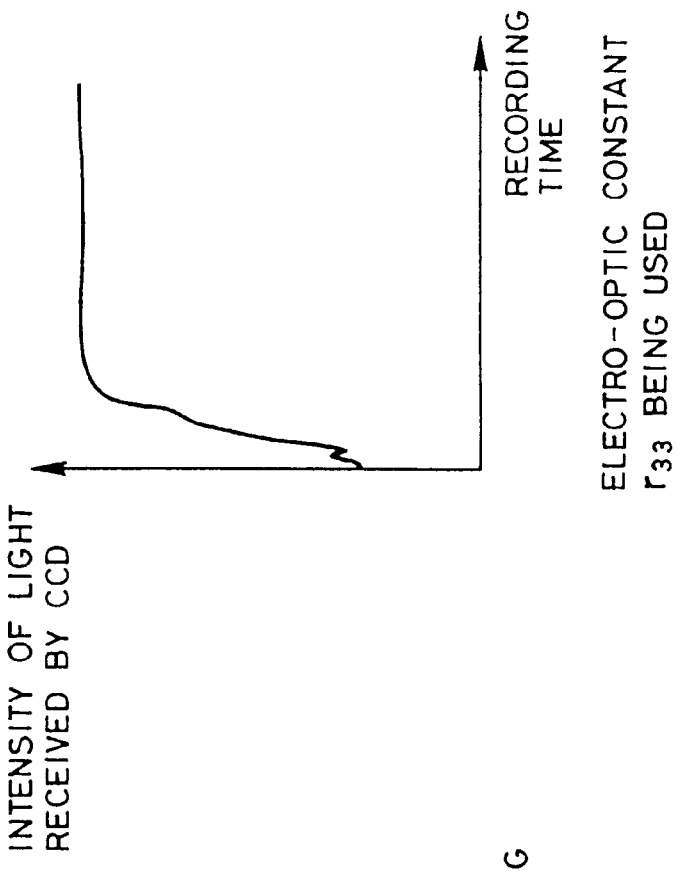
FIGS. 9A and 9B are diagrams explaining characteristics of a further embodiment of a recording medium according to the invention.
Figure 9B:
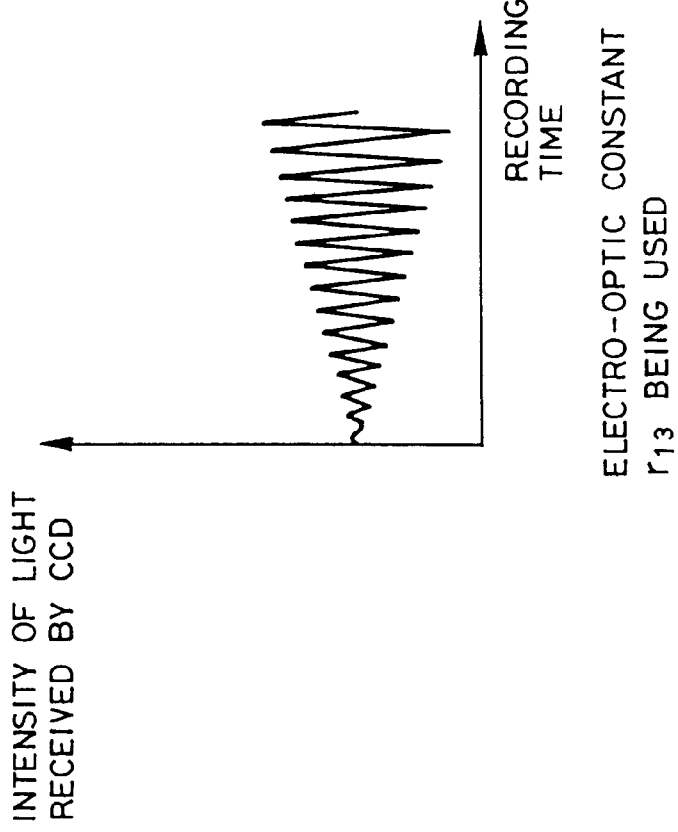

As shown in FIGS. 9A and 9B, basically, recording of a hologram is carried out by recording optical mode coupling between a recording beam and the reference beam in the recording medium of photo refractive crystal as changes in refractive index occurring within the recording medium. The intensity of the light which the CCD receives is determined in two modes. When light power is exchanged periodically between the reference beam and the signal beam, for example, in a recording medium using $LiNbO_3$ which is doped with Fe and positioned such that changes in the refractive index occur within the crystal according to an electro-optic constant $r_{13}$, as shown in FIG. 9A, an image which is being recorded blinks repeatedly with formation of diffraction gratings. On the other hand, in a recording medium positioned such that changes in refractive index occur within the crystal due to a photo refractive effect according to an electro-optic constant $r_{33}$ as shown in FIG. 9B, the light power of the reference beam is absorbed in the recording beam.

In these phenomena, as recording in the recording medium proceeds, the shift or transfer of the light power becomes more pronounced. That is, FIG. 9A shows a case in which there occurs an enhancement of contrast in light intensity of the diffracted light between light and dark caused by blinking, while FIG. 9B shows a case in which there simply occurs an increase in amount of the diffracted light.

The present embodiment is distinguished from the above embodiments in that the monitoring means is provided with a filter for decreasing an amount of received light. FIG. 10 shows an apparatus according to the present embodiment. Component parts and elements corresponding to those of the above embodiments shown in FIG. 1 are indicated by identical reference numerals, and description thereof is omitted. In the optical system, an adjustable filter 81 which is capable of attenuating light over a large adjustable range is provided for the two-dimensional photodetector array 21 of the CCD camera, and a mixture of the transmitted signal beam and the diffracted reference beam is detected with increased attenuation during recording. Diffraction efficiency is calculated back from the luminance of the reproduced image for real-time and optimum recording.

When there is a contrast in light intensity of the diffracted light between light and dark caused by blinking as shown in FIG. 9A, luminance difference between the light and the dark blinking is monitored to keep track of the recording state and control the same.

In such a case as shown in FIG. 9B, the luminance of an image which is being recorded increases with formation of diffraction gratings, so that the recording state is controlled such that the luminance reaches a predetermined level.

Figure 11:
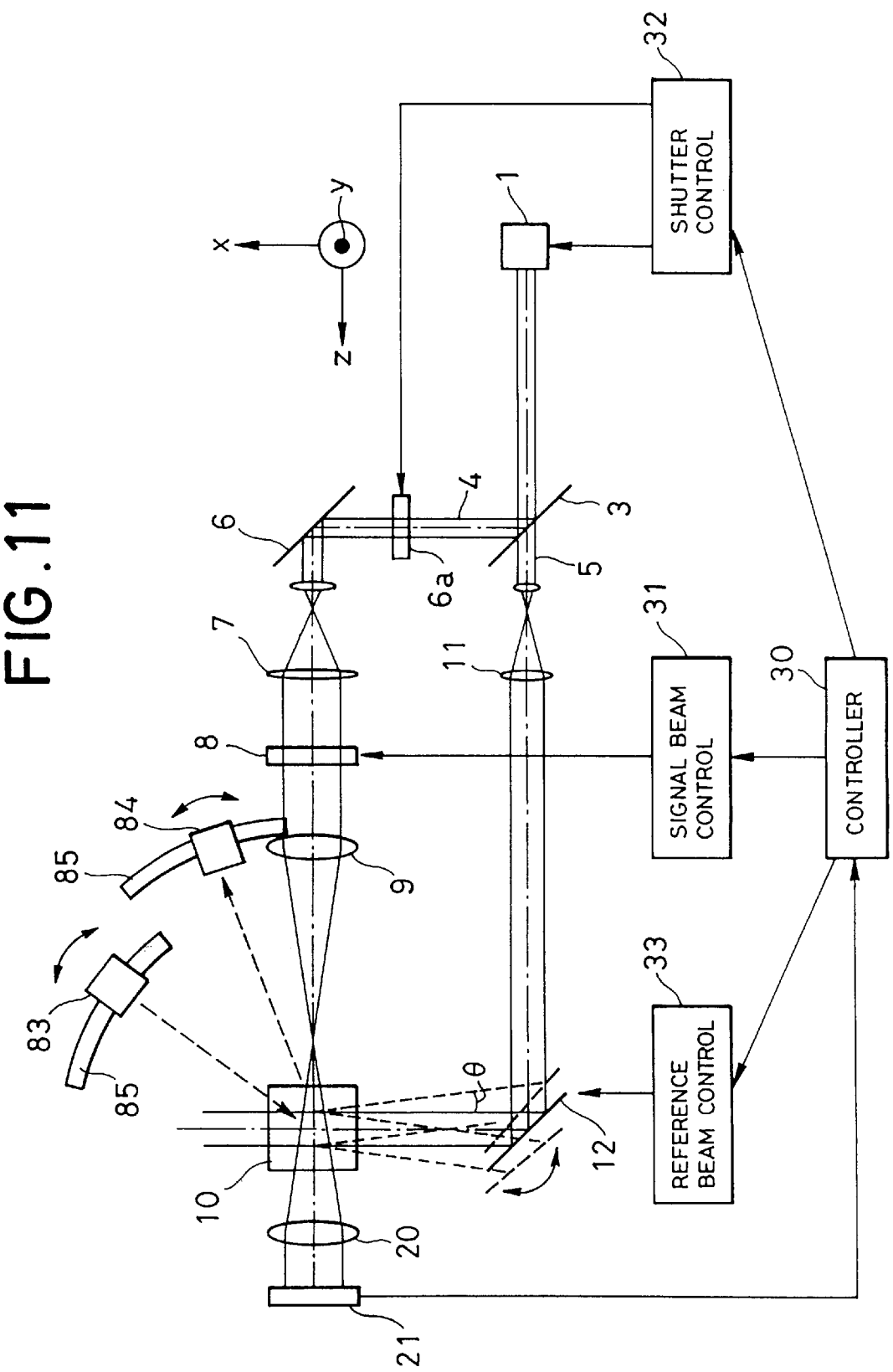
FIG. 11 is a block diagram showing essential parts of a still further embodiment of a volume holographic memory-based optical information-recording/reproducing apparatus according to the invention.

Next, a still further embodiment of the invention will be described with reference to FIG. 11. Component parts and elements corresponding to those of the above embodiment shown in FIG. 1 are indicated by identical reference numerals, and description thereof is omitted. An apparatus of this embodiment includes a laser 83, and a drive mechanism 85. The laser 83 serves as monitoring beam-irradiating means for applying a monitoring beam having a wavelength different from that of the signal beam to the portion within the recording medium 10 in which the reference beam and the signal beam intersect with each other. The driving mechanism 85 moves the monitoring beam-irradiating means such that a light receiver 84 as monitoring means can receive the monitoring light reflected off the portion within the recording medium 10. The monitoring means may comprise a two-dimensional photodetector array.

The laser 83 uses a laser beam having a wavelength different from that of the signal beam as the monitoring beam. The laser 83 may consist of a He-Ne laser beam. Since the laser beam has the wavelength different from that of the signal beam, the Bragg angle is also different from that of the signal beam. This makes it possible to add a monitoring optical system to the conventional optical system for recording and reproduction of information. When an angle multiple recording method is employed as the multiple recording method, it is required to change the incidence angle of the monitoring beam from the monitoring optical system as shown in FIG. 11. Therefore, the laser 83 and the light receiver 84 are shifted in position by the drive mechanism 85 as shown in the figure, to change the incidence angle of the monitoring beam incident on the recording medium. The drive mechanism 85 may include a movable stage and a galvano mirror, two pairs of galvano mirrors, or an audio optical deflecting (AOD) element. The monitoring optical system makes it possible to monitor formation of diffraction gratings during recording independently. Information obtained from the monitoring is fed back for use in controlling a recording time period.

Assuming that the light receiver 84 for monitoring comprises a CCD camera, it is possible to obtain a reproduced image of data in real time while the data is being recorded. Therefore, it is also possible to calculate an error ratio of the recording from the reproduced image and perform more appropriate control of the recording in real time.

The light receiver 84 may comprise a photodiode. In this case, the adjustment for the pixel adjustment is not necessary, and hence its installation is simplified. The state of formation of diffraction ratings can be kept track of by monitoring the diffraction intensity.

In a conventional holographic memory made of lithium niobate (LN), information is recorded by utilizing the photo refractive effect. Since the photo refractive effect has no definite threshold value for recording, it is possible to record a relatively feeble light below 1 (W/cm$^2$). However, the photo refractive effect has no threshold value for record erasure, either, so that a record is degraded even by irradiation thereon for multiple recording or reproduction.

Now, the present embodiment will be described in further detail based on an example of a 1000-page multiple recording operation.

If recording is performed on 1000 pages with an identical recording power and over an identical time period per page, a record on the first page is inevitably degraded by recording beams for recording on other pages during recording of the second page and the following ones. For this reason, assuming that the intensity of the diffracted light is equal to "1" immediately after completion of recording on the first page, it is decreased to "0.94" (although the value can differ dependently on the characteristic of the crystal) after recording on the second page, to "0.92" after recording on the third page . . . , and eventually the intensity of the diffracted light is decreased to a very low level when recording on the 1000th page is finished. Thus, the quantity of diffracted light on each of the pages obtained after completion of the recording on the 1000th page is not even but different from page to page. A conventional technique to overcome this problem is to carry out scheduling in which the quantity of erasure of each page to be caused by recording operations of the other pages is calculated in advance, and initial recording is carried out to an increased degree corresponding to the calculated intensity. However, according to the method of the present embodiment, it is possible to compensate for the erasure in real time.

Figure 12:
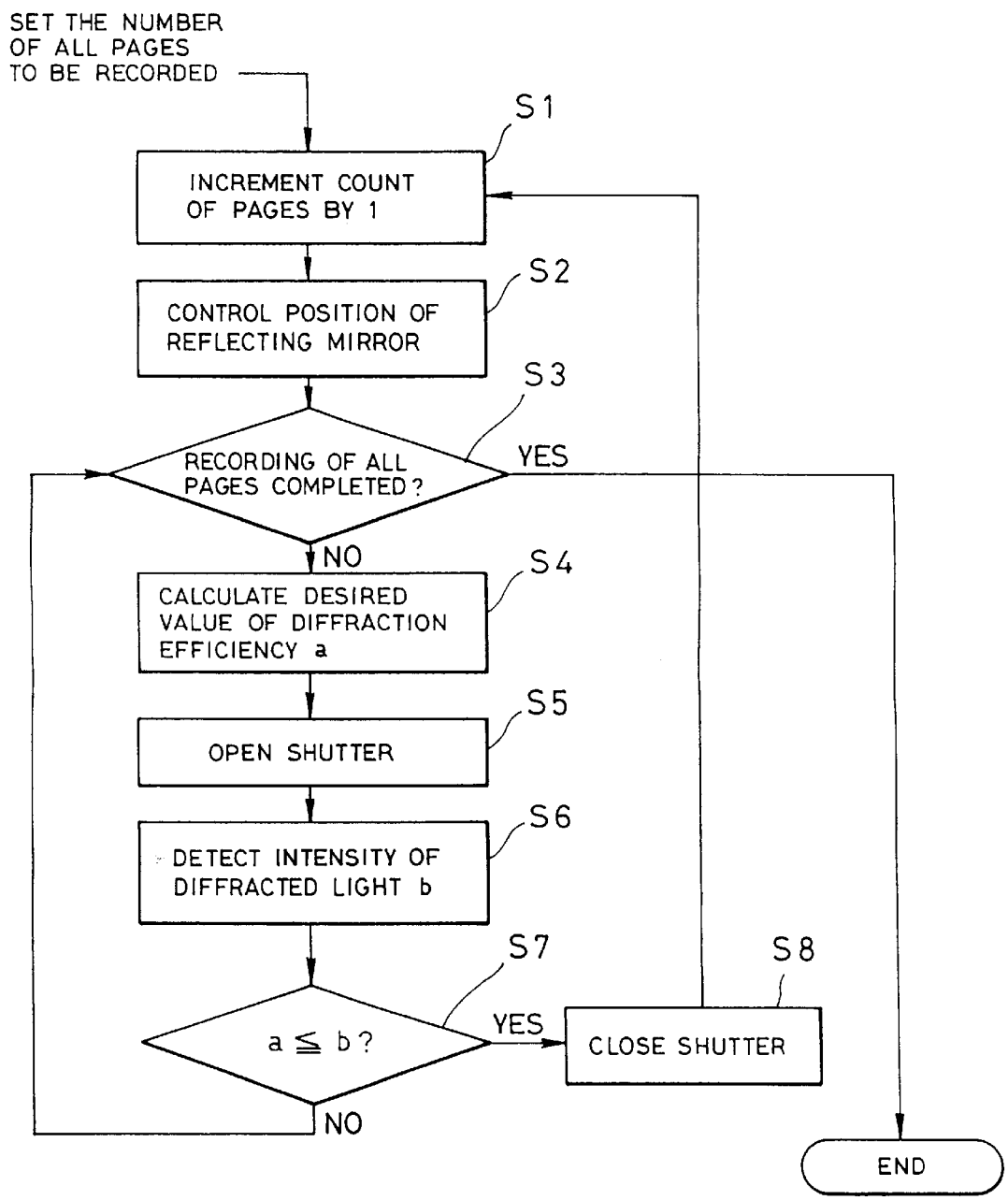
FIG. 12 is a flowchart showing a procedure of schedule control.

FIG. 12 shows an example of a recording procedure carried out by the apparatus according to the present embodiment. As shown therein, first, the number of all recording pages is set, and the number of recorded pages is counted from an initial value thereof in step S1. Then, position control of the reflecting mirror for the monitoring beam is performed in step S2, and it is determined in step S3 whether recording of all the pages is completed. If the recording is not completed, a desired value a of diffraction efficiency is calculated in step S4. Then, the shutter is opened in step S5, and the intensity of diffracted light b is detected in step S6. In the following step S7, it is determined whether the intensity b is equal to or smaller than the desired value a. If the intensity b is equal to or larger than the desired value a, the program returns to step S1, wherein the number of the pages is counted again. On the other hand, if the intensity b is larger than the desired value a, the program returns to step S3, wherein it is judged that the recording of all the pages is completed, followed by terminating the program. Thus, it is possible to monitor recording on a page-by-page basis in real time.

While there have been described preferred embodiments of the present invention, it is to be understood that various modifications and variations will occur to those skilled in the art without departing from the spirit and scope of the invention as hereinafter claimed.

What is claimed is:

1. A volume holographic memory-based optical information-recording/reproducing apparatus in which a recording medium is mounted for recording a three-dimensional optical interference pattern formed by at least two coherent light beams as spatial changes in refractive index of said recording medium, said apparatus comprising:
   a signal beam optical system for applying a coherent signal beam to said recording medium via a Fourier transform lens,
   a reference beam optical system for applying a coherent reference beam to said recording medium,
   means for causing said reference beam to intersect with said signal beam within said recording medium to change an angle of intersection between said reference beam and said signal beam, and
   means for detecting diffracted light of said reference beam diffracted from said recording medium, said apparatus further comprising spatial beam modulating means arranged in an optical path of said reference beam and proximate to or in contact with said recording medium, said spatial beam modulating means being for limiting light intensity of said reference beam in a manner such that a cross section of said reference beam in said recording medium has a light intensity distribution opposite to a light intensity distribution of a cross section of said signal beam in said recording medium.

2. The apparatus according to claim 1, wherein said light intensity distribution of said signal beam results from transformation of said signal beam by said Fourier transform lens within a plane containing said signal beam and perpendicular to a plane on which said signal beam and said reference beam lie, and said spatial beam modulating means modulates said reference beam in a manner such that said reference beam in said recording medium has a cross section having a light intensity distribution generally opposite in phase to said light intensity distribution of said signal beam in said recording medium resulting from transformation of said signal beam by said Fourier transform lens.

3. The apparatus according to claims 1 or 2, wherein said spatial beam modulating means modulates said reference beams in a manner such that said cross section of said reference beam has a light intensity distribution in which intensity is lowest on a side of said recording medium on which said signal beam is incident and increases progressively toward an opposite side of said recording medium.

4. The apparatus according to claim 1, wherein said spatial beam modulating means comprises a liquid crystal panel arranged perpendicularly to a plane on which said signal beam and said reference beam exists and in parallel with said plane containing said signal beam, said crystal panel being electrically controlled to undergo a change to have an optically transparent portion having a transmittance distribution in which transmittance is lowest on a side of said recording medium on which said signal beam is incident and increases progressively toward an opposite side of said recording medium and which is opposite in phase to said light intensity distribution of said signal beam, and an optically opaque portion.

5. The apparatus according to claim 4, wherein said spatial beam modulating means comprises a Fourier transform lens having a Fourier surface thereof spaced away from an optical axis of said signal beam and at least one spatial light modulator, wherein said spatial light modulator comprises a diffraction grating that forms a light intensity distribution of 0-order diffracted light of said reference beam by means of said Fourier transform lens substantially in parallel with said optical axis of said signal beam.

6. The apparatus according to claim 1, wherein said means for detecting said diffracted light comprises:
   a charge coupled element image sensor having a plurality of light-receiving pixel elements disposed on a plane perpendicular to an optical axis of said diffracted light from said recording medium at predetermined intervals of a pitch,
   a pinhole array formed by a flat shade board having a plurality of apertures formed at said predetermined intervals of a pitch in a manner corresponding to said light-receiving pixel elements, said flat shade board held apart from said light-receiving pixel elements in a manner movable along said plane in directions orthogonal to each other, and
   a drive element for driving said pinhole array in said directions orthogonal to each other.

7. The apparatus according to claim 6, wherein said drive element comprises a piezoelectric element.

8. A volume holographic memory-based optical information-recording/reproducing apparatus according to claims 6 or 7, wherein said pinhole array comprises a microlens array having convex lens fitted in said plurality of apertures, respectively, and shading material filling between said convex lenses.

9. The apparatus according to claims 6 or 7, wherein said pinhole array comprises a microlens array having distribution dioptric flat plate lens fitted in said plurality of apertures, respectively, and shading material filling between said distribution dioptric flat plate lenses.

10. The apparatus according to claim 1, further comprising monitoring means for detecting diffracted light leaking from a portion inside said recording medium in which said reference beam and said signal beam intersect with each other, and shutter control means for controlling blink of said signal beam in response to a signal from said monitoring means.

11. The apparatus according to claim 10, wherein said monitoring means comprises means for detecting said diffracted light of said reference beam from said recording medium, said means having a filter for decreasing intensity of received light.

12. The apparatus according to claim 10, further comprising monitoring beam-irradiating means for irradiating said portion inside said recording medium in which said reference beam and said signal beam intersect with each other with a monitoring beam having a wavelength different from that of said signal beam, and means for moving said monitoring beam-irradiating means in a manner such that said monitoring means can receive said monitoring beam reflected from said portion inside said recording medium.

13. A volume holographic memory-based optical information-recording/reproducing apparatus, comprising:
   a recording medium, which records a three-dimensional optical interference pattern as spatial changes in refractive index of said recording medium;
   a coherent light source producing a coherent light beam;
   a beam splitter, splitting the coherent light beam into a coherent reference beam and a coherent signal beam;
   a signal beam optical system which applies the coherent signal beam to said recording medium;
   a spatial beam modulator, in an optical path of the coherent reference beam and proximate to or in contact with said recording medium, limiting the light intensity of the coherent reference beam through a transmission surface having a transmittance distribution that is opposite in profile to a light intensity distribution of a cross section of the signal beam in said recording medium;
   a tracking optical system which directs the coherent reference beam to enter said recording medium at a plurality of differing angles of incidence; and
   a detector which detects light radiating from said recording medium.

14. The apparatus of claim 13, wherein said signal beam optical system includes a Fourier transform lens.

15. The apparatus of claim 13, further comprising an inverse Fourier transform lens between said recording medium and said detector.

16. The apparatus of claim 13, further comprising an adjustable filter placed between said detector and said recording medium which attenuates the light radiating from said recording medium.

17. The apparatus according to claim 16, wherein the light attenuated by said adjustable filter is a mixture of the transmitted signal beam and the diffracted reference beam radiating from said recording medium.

18. The apparatus of claim 13, wherein said spatial beam modulator has the transmittance distribution oriented so that a cross section of the reference beam within said recording medium has a light intensity distribution which is the lowest toward a side of said recording medium on which the signal beam is incident and increases progressively in intensity toward an opposite side of said recording medium.

19. The apparatus of claim 13, wherein said spatial beam modulator has the transmittance distribution oriented so that transmittance is lowest through a portion of the transmission surface most near to where the signal beam is incident on said recording medium and which is highest through a portion toward an opposite side of said transmission surface.

20. The apparatus of claim 13, wherein said transmission surface of said spatial beam modulator is a liquid crystal panel being controlled to generate the transmittance distribution.

21. The apparatus of claim 13, wherein said spatial beam modulator further comprises a Fourier transform lens.

22. The apparatus according to claim 21, wherein said spatial beam further comprises a diffraction grating.

23. The apparatus according to claim 22, wherein said diffraction grating of said spatial beam modulator forms a light intensity distribution of 0-order diffracted light of the reference beam.

24. The apparatus according to claim 21, wherein said spatial beam modulator further comprises a plurality of diffraction gratings.

25. The apparatus of claim 13, wherein the detector comprises:
   a charge coupled device having a plurality of light-receiving pixels disposed at predetermined intervals of a pitch on a plane perpendicular to an optical axis of diffracted light from the reference beam radiating from said recording medium,
   a pinhole array formed by a flat shade having a plurality of apertures formed at the predetermined intervals of a pitch of said light-receiving pixels, said pinhole array held apart from said light-receiving pixels in a manner movable along the plane, and
   a plurality of drive elements which move said pinhole array in orthogonal directions along the plane.

26. The apparatus according to claim 25, wherein said plurality of drive elements of said detector are piezoelectric elements.

27. The apparatus according to claim 25, wherein said pinhole array of said detector comprises a microlens array having a convex lens fitted in each aperture of said plurality of apertures, and a shading material filling between said convex lenses.

28. The apparatus according to claim 25, wherein said pinhole array of said detector comprises a microlens array having a distribution dioptric flat plate lens fitted in each aperture of said plurality of apertures, and a shading material filling between said convex lenses.

29. The apparatus of claim 13, wherein said signal beam optical system includes a shutter in an optical path of the signal beam.

30. The apparatus according to claim 29, wherein said shutter of said signal beam optical system blinks open and closed during recording.

31. The apparatus according to claim 30, wherein said shutter of said signal beam optical system blinks at a rate corresponding to the intensity of the light reaching said detector.

32. The apparatus of claim 13, wherein the reference beam and the signal beam intersect within said recording medium, creating the three-dimensional optical interference pattern.

33. The apparatus of claim 32, wherein said spatial beam modulator modulates the reference beam so that, at the point of intersection of the signal beam and the reference beam, a phase cross section of the reference beam is substantially opposite in phase to the cross section of the signal beam.

34. The apparatus according to claim 32, further comprising:
 a second coherent light source, producing a coherent monitoring beam having a wavelength different from the signal beam and directed to a portion of said recording medium where the reference beam and the signal beam intersect; and
 a light receiver which detects light of the monitoring beam reflected off the portion of said recording medium where the reference beam and the signal beam intersect.

35. The apparatus according to claim 34, further comprising:
 a monitoring source optical tracking system which directs the monitoring beam to the portion of said recording medium where the reference beam and the signal beam intersect.

36. The apparatus according to claim 34, further comprising:
 a monitoring source driving mechanism which moves said second coherent light source, directing the monitoring beam to the portion of said recording medium where the reference beam and the signal beam intersect.

37. The apparatus according to claim 34, further comprising:
 a monitoring detector optical tracking system which directs the light of the monitoring beam reflected off the portion of said recording medium where the reference beam and the signal beam intersect into said light receiver.

38. The apparatus according to claim 34, further comprising:
 a monitoring detector driving mechanism which moves said light receiver to a position to detect the light of the monitoring beam reflected off the portion of said recording medium where the reference beam and signal beam intersect.

39. The apparatus according to claim 34, wherein said light receiver comprises a charge-coupled device camera, which includes a charge coupled device having a plurality of light-receiving pixels.

40. The apparatus according to claim 34, wherein said light receiver comprises a photodiode.

* * * * *